(12) United States Patent
Chen et al.

(10) Patent No.: US 11,973,170 B2
(45) Date of Patent: *Apr. 30, 2024

(54) SEMICONDUCTOR PACKAGE AND MANUFACTURING METHOD OF SEMICONDUCTOR PACKAGE

(71) Applicant: Taiwan Semiconductor Manufacturing Company, Ltd., Hsinchu (TW)

(72) Inventors: Ming-Fa Chen, Taichung (TW); Hsien-Wei Chen, Hsinchu (TW); Jie Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/960,151

(22) Filed: Oct. 5, 2022

(65) Prior Publication Data

US 2023/0024220 A1    Jan. 26, 2023

Related U.S. Application Data

(63) Continuation of application No. 16/941,556, filed on Jul. 29, 2020, now Pat. No. 11,482,649.

(51) Int. Cl.
| | |
|---|---|
| *H01L 33/52* | (2010.01) |
| *G02B 6/12* | (2006.01) |
| *G02B 6/42* | (2006.01) |
| *H01L 25/16* | (2023.01) |
| *H01L 31/0203* | (2014.01) |
| *H01L 31/0232* | (2014.01) |
| *H01L 31/18* | (2006.01) |

(Continued)

(52) U.S. Cl.
CPC .......... *H01L 33/52* (2013.01); *G02B 6/12004* (2013.01); *G02B 6/4206* (2013.01); *H01L 25/167* (2013.01); *H01L 31/0203* (2013.01); *H01L 31/02325* (2013.01); *H01L 31/18* (2013.01); *H01L 33/58* (2013.01); *H01L 33/62* (2013.01); *H01L 2933/005* (2013.01); *H01L 2933/0058* (2013.01)

(58) Field of Classification Search
CPC ......... H01L 33/52; H01L 33/58; H01L 33/62; H01L 31/0203; H01L 31/02325; H01L 31/18; H01L 25/167; H01L 2933/005; H01L 2933/0058; G02B 6/12004; G02B 6/4206
USPC .......................................................... 257/98
See application file for complete search history.

(56) References Cited

U.S. PATENT DOCUMENTS

| | | | | |
|---|---|---|---|---|
| 11,482,649 | B2 * | 10/2022 | Chen | G02B 6/4206 |
| 2021/0225824 | A1 * | 7/2021 | Islam | G02B 6/4269 |

* cited by examiner

*Primary Examiner* — Igwe U Anya
(74) *Attorney, Agent, or Firm* — JCIPRNET

(57) ABSTRACT

A semiconductor package includes a photonic die, an encapsulated electronic die, a substrate, and a lens structure. The photonic die includes an optical coupler. The encapsulated electronic die is disposed over and bonded to the photonic die. The encapsulated electronic die includes an electronic die and an encapsulating material at least laterally encapsulating the electronic die. The substrate is disposed over and bonded to the encapsulated electronic die. The lens structure is disposed over the photonic die and is overlapped with the optical coupler from a top view. The optical coupler is configured to be optically coupled to an optical signal source through the lens structure.

20 Claims, 18 Drawing Sheets

(51) Int. Cl.
*H01L 33/58* (2010.01)
*H01L 33/62* (2010.01)

SEMICONDUCTOR PACKAGE AND MANUFACTURING METHOD OF SEMICONDUCTOR PACKAGE

CROSS-REFERENCE TO RELATED APPLICATION

This application is a continuation application of and claims the priority benefit of a prior application Ser. No. 16/941,556, filed on Jul. 29, 2020. The entirety of each of the above-mentioned patent applications is hereby incorporated by reference herein and made a part of this specification.

BACKGROUND

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links. However, contemporary optical communication systems are expensive and complicated in manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
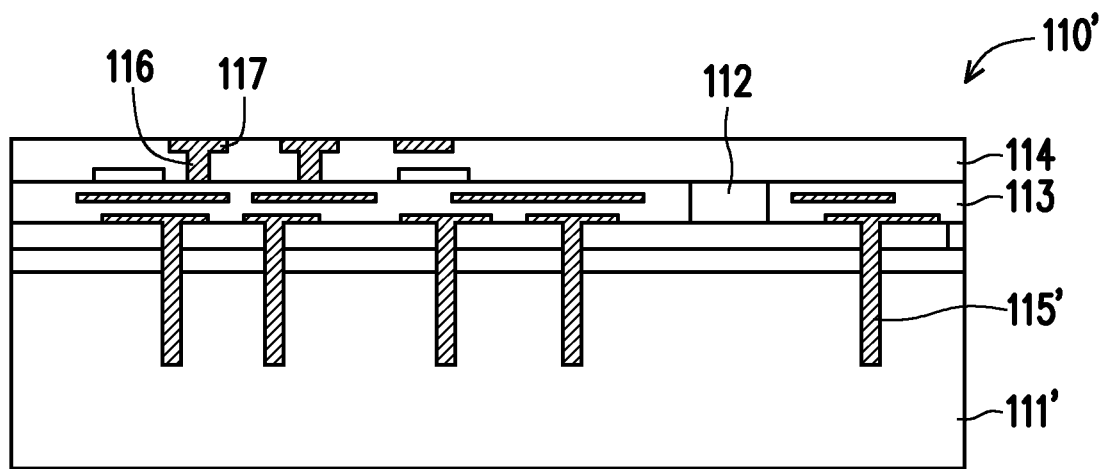
FIG. 1 to FIG. 10 illustrate cross sectional views of intermediate stages in the manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 10 illustrate cross sectional views of intermediate stages in the manufacturing of a semiconductor package according to some exemplary embodiments of the present disclosure. Referring to FIG. 1, in accordance with some embodiments of the disclosure, FIG. 1 illustrates a cross sectional view of photonic die 110', which may be mounted on a carrier (not shown). In some embodiments, the photonic die 110' shown in FIG. 1 is a part of a wafer, which includes a plurality of (identical) photonic dies 110' arranged as an array, although one photonic die 110' is illustrated herein. In some embodiments, the photonic die 110' includes an optical coupler 112, which is configured to be optically coupled to an optical signal source such as optical fibers, or the like. Namely, the photonic die 110' has functions of receiving optical signals, transmitting the optical signals inside the photonic die 110', transmitting the optical signals out of the photonic die 10, and communicating electronically with an electronic die (e.g., the electronic die 120 shown in FIG. 2). Accordingly, the photonic die 110' is also responsible for the input-output (10) of the optical signals.

In some exemplary embodiments, the photonic die 110' includes a substrate 111'. The substrate 111' may be a semiconductor substrate, which may be a silicon substrate, a silicon germanium substrate, or a substrate formed of other semiconductor materials. In accordance with alternative embodiments of the present disclosure, the substrate 111' is a dielectric substrate formed of, for example, silicon oxide. In at least one embodiment, the substrate 111' may have a silicon on insulator (SOI) structure. For example, the substrate 111' may include a buried oxide (BOX) layer.

Figure 10:
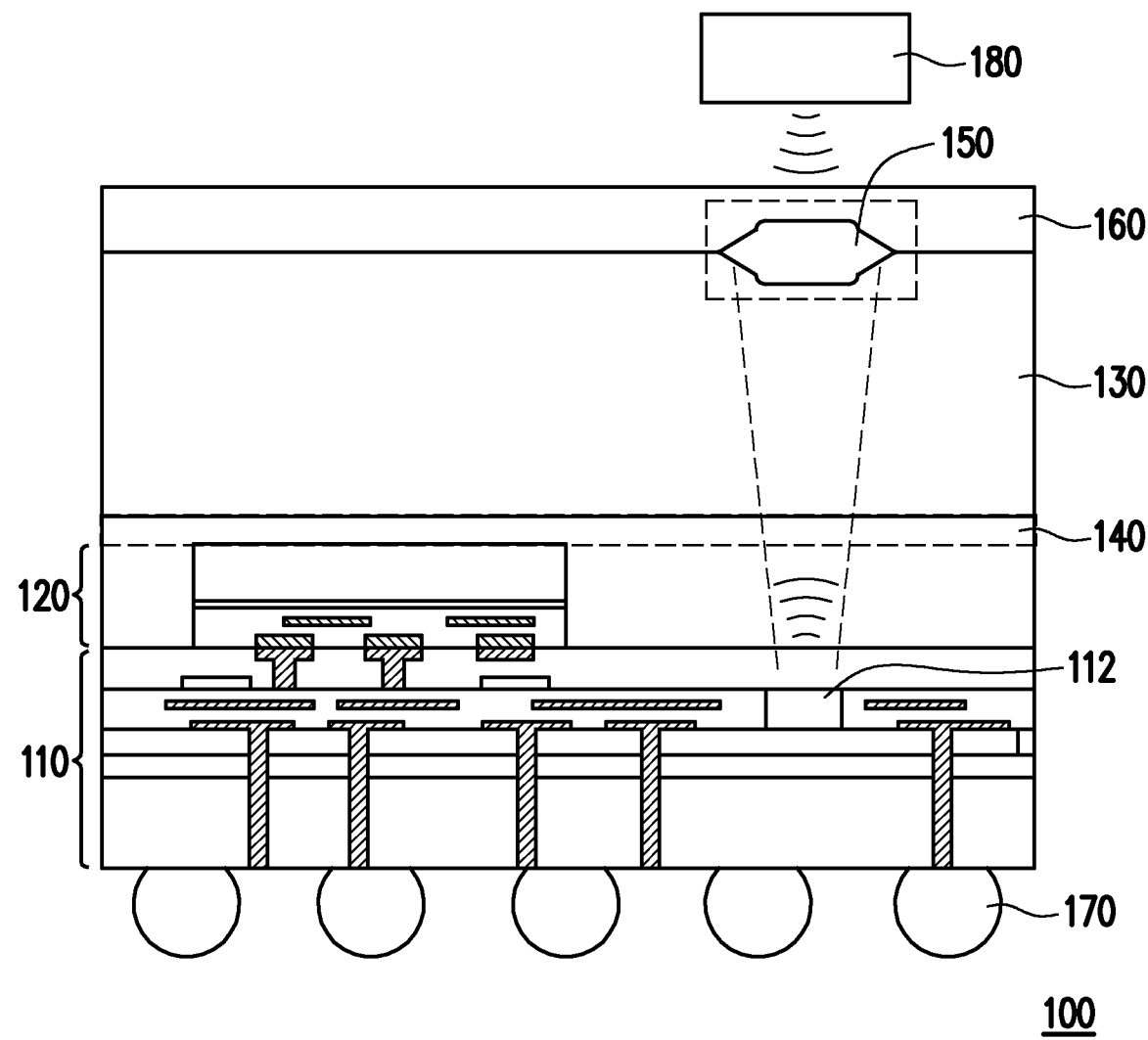

In accordance with some embodiments of the present disclosure, the photonic die may be used as an interposer, and includes through vias (also referred to as through substrate vias or through silicon vias) penetrating through the substrate. Such through vias (e.g., the through vias 115 shown in FIG. 10) are formed of a conductive material, which may also be a metallic material such as tungsten, copper, titanium, or the like. The process of forming through vias may start with a plurality of blind vias 115' as it is shown in FIG. 1, and eventually exposed such that the metal is substantially coplanar with the back surface of the substrate as it is shown in FIG. 10.

In accordance with some embodiments of the present disclosure, integrated circuit devices may be formed at the top surface of substrate 111'. In accordance with some embodiments of the present disclosure, the integrated circuit devices may include active devices such as transistors and/or diodes (which may include photo diodes). The integrated circuit devices may also include passive devices such as capacitors, resistors, or the like. In accordance with alternative embodiments of the present disclosure, no active devices are formed, while passive devices may be formed in the photonic die 110'.

Figure 12:
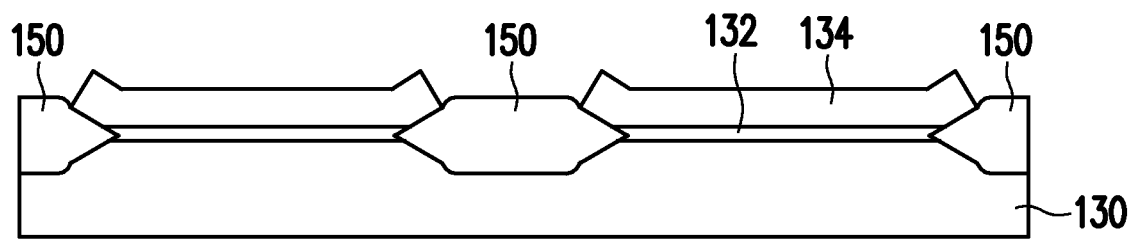

In at least one embodiment, the substrate 111' may include a buried oxide (BOX) layer 1112 and a silicon layer 1113, which is formed over, and may contact, the buried oxide layer 1112. In some embodiments, the silicon layer 1113 may be patterned, and is used to form the waveguides for the internal transmission of optical signals. In some embodiments, the optical coupler 112 is a grating coupler, but the disclosure is not limited thereto. The optical coupler 112 is formed on the silicon layer 1113, and the top portions of the optical coupler 112 may have grating, so that the optical coupler 112 have the function of receiving light or transmitting light. The optical coupler 112 used for receiving light receive the light from the overlying light source or optical signal source (such as optical signal source 180 as shown FIG. 12) and transmit the light to waveguide 1113. The optical coupler 112 used for transmitting light receives light from waveguide 1113 and transmit light to the optical fiber 180 (FIG. 12). It is appreciated that the photonic die 110' may include various other devices and circuits that may be used for processing and transmitting optical signals and electrical signals, which are also contemplated in accordance with some embodiments of the present disclosure.

FIG. 1 also illustrates interconnect structure 114 formed over the optical coupler 112. The interconnect structure 114 includes a plurality of dielectric layers and metal lines and vias. The dielectric layers may be formed of a light-transparent material such as silicon oxide. The dielectric layers may also be formed of silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. The metal lines and vias 116 may be formed using damascene processes, and may include, for example, copper on diffusion barrier layers. The diffusion barrier layers may be formed of titanium, titanium nitride, tantalum, tantalum nitride, or the like.

In some embodiments, a plurality of bonding pads 117 are formed over and connected to metal lines/vias 116. The bonding pads 117 may be formed of aluminum copper, but the disclosure is not limited thereto. The bonding pads 117 are electrically connected to the integrated circuit devices and/or buried vias 115' through interconnect structure 114, which the integrated circuit devices may be light-to-electrical conversion devices and/or electrical-to-light conversion devices. The light-to-electrical conversion devices and/or electrical-to-light conversion devices may be built inside the photonic die 110' or external to and attached to the photonic die 110'. The light-to-electrical conversion devices may include photo diodes. The electrical-to-light conversion devices may include light emitting didoes, lamps, or the like.

Figure 2:
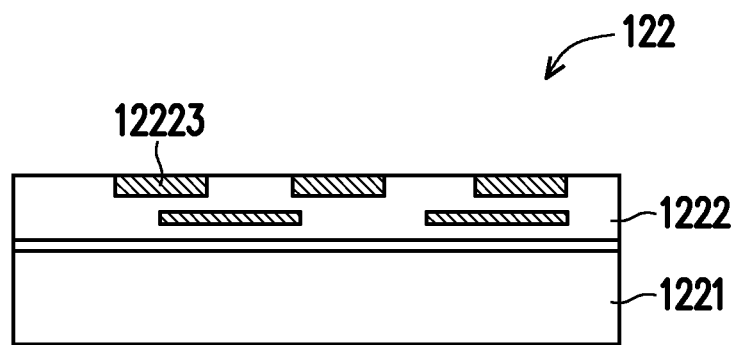
Figure 3:
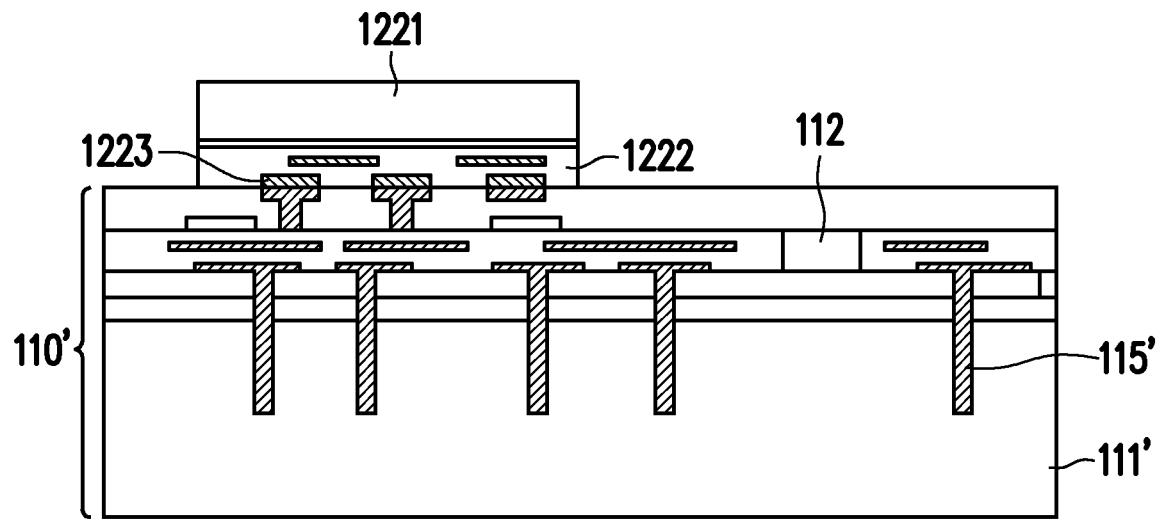

With now reference to FIG. 2 and FIG. 3, an electronic die 122 is provided and bonded over the photonic die 110'. In accordance with some embodiments of the present disclosure, the electronic die 122 acts as a central processing unit, which includes the controlling circuit for controlling the operation of the devices in the photonic die. The electronic die 122 also exchanges electrical signals with the photonic die through bonding regions. In addition, the electronic die 122 includes the circuits for processing the electrical signals converted from the optical signals in the photonic die. In some embodiments, the electronic die 122 is not overlapped with the optical coupler 112 from a top view, so the optical coupler 112 can be optically coupled to the optical fiber 180 (FIG. 12) without being interfered by the electronic die 122.

In some embodiments, the electronic die 122 may firstly be a part of a wafer, which includes a plurality of electronic dies 122 arranged as an array, and then be diced into a plurality of (separated) electronic dies 122. The electronic dies 122 may include a substrate 1221, an interconnect structure 114 including a plurality of dielectric layers and metal lines and vias. The dielectric layers may also be formed of silicon oxide, silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. The metal lines and vias may be formed using damascene processes, and may include, for example, copper on diffusion barrier layers. The diffusion barrier layers may be formed of titanium, titanium nitride, tantalum, tantalum nitride, or the like. A plurality of bonding pads 1223 are formed over and connected to metal lines/vias. The bonding pads 1223 may be formed of aluminum copper, but the disclosure is not limited thereto.

In the present embodiment, the photonic die 110' is in a wafer form, and the diced electronic dies 122 may be picked and placed over the photonic die 110'. That is to say, the bonding process shown in FIG. 3, in the present embodiment, is a die to wafer process. It is noted that more or less dies may be provided on the photonic die 110'. In the present embodiment, the electronic die 122 is bonded with the photonic die 110' by die to wafer bonding process. For example, direct metal to metal thermal compression bonding, or any type of hybrid bonding technique may be applied. After the bonding process, the bonding pads 1223 of the electronic die 122 are bonded to the bonding pads 117 of the photonic die 110' respectively.

Figure 4:
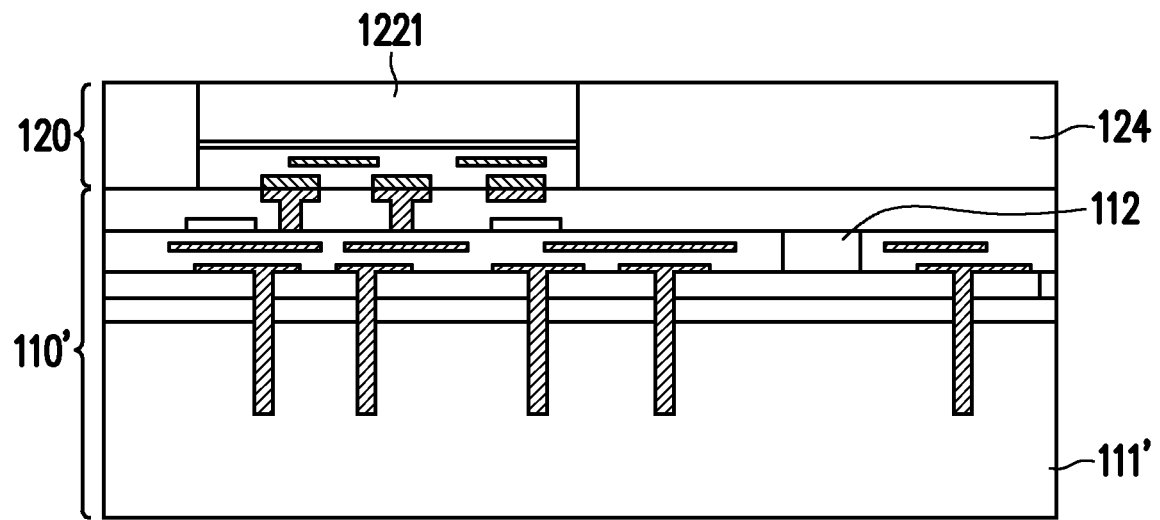

With now reference to FIG. 4, an encapsulating material 124 is provided over the photonic die 110'. The encapsulating material 124 at least laterally encapsulates the electronic die 122. In some embodiments, the encapsulating material 124 may be formed of a light-transparent material such as silicon oxide, or any other suitable oxide material. In some embodiments, an upper surface of the encapsulating material 124 may be firstly higher than an upper surface of the electronic die 122. Namely, the encapsulating material 124 may firstly cover the upper surface of the electronic die 122.

Then, a thinning process may be performed on the encapsulating material 124 to reveal the upper surface of the electronic die 122 for further processing. The thinning process may be, for example, a mechanical grinding or CMP process whereby chemical etchants and abrasives are utilized to react and grind away the encapsulating material 124 until the electronic die 122 has been revealed. The resulting structure is shown in FIG. 4. After the thinning process is performed, the upper surface of the electronic die 122 is substantially level with the upper surface of the encapsulating material 124. However, while the CMP process described above is presented as one illustrative embodiment, it is not intended to be limiting to the embodiments. Any other suitable removal process may alternatively be used to thin the encapsulating material 124 and the electronic die 122. For example, a series of chemical etches or any other suitable process may alternatively be utilized, and all such processes are fully intended to be included within the scope of the embodiments. In an alternative embodiment, the thinning process may be omitted, and the encapsulating material 124 may cover or reveal the upper surface of the electronic die 122. Throughout the description, the resultant structure including the electronic die 122 and the encapsulating material 124 is referred to as an encapsulated electronic device 120, which may have a wafer form in the process.

Figure 5:
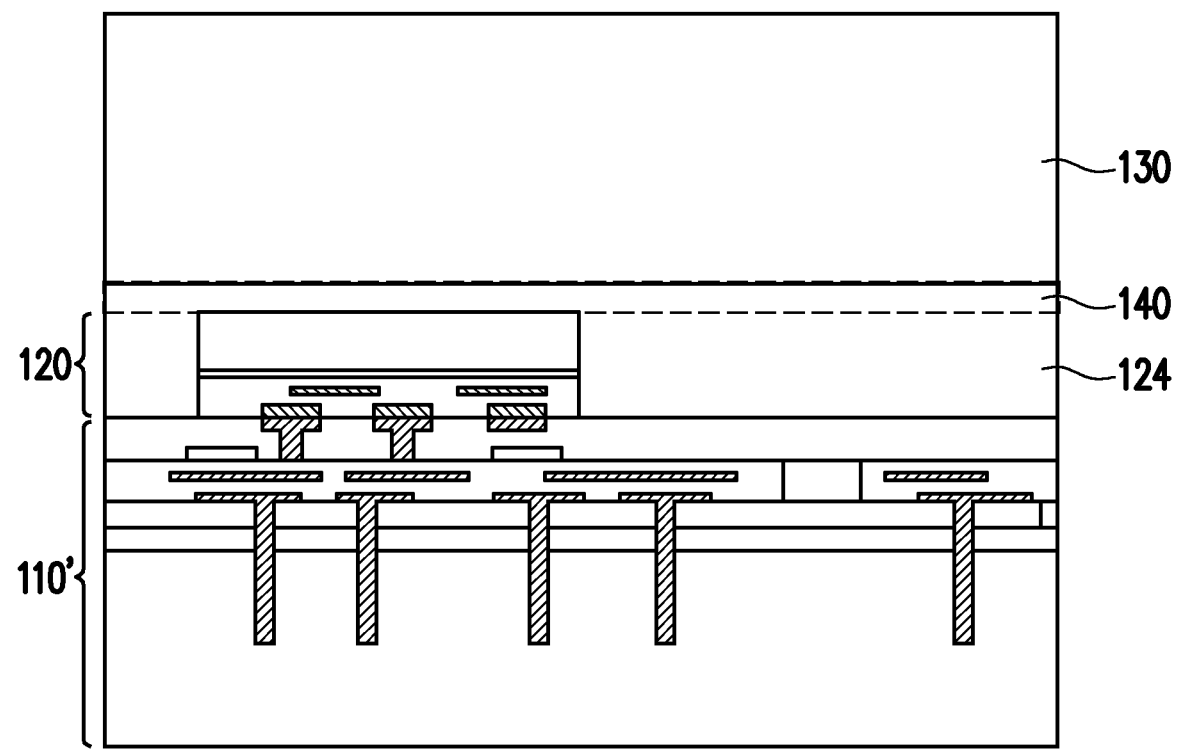

With now reference to FIG. 5, in some embodiments, a substrate 130 is bonded over the encapsulated electronic die 120. The substrate 130 is bonded to the encapsulated electronic die 120 through a bonding layer 140. Namely, the bonding layer 140 is disposed between the encapsulated electronic die 120 and the substrate 130. In some embodiments, the substrate 130 is configured to provide mechanical strength to the package. In at least one embodiment, the substrate 130 may include silicon (Si). In some embodiments, the substrate 130 may include a semiconductor element, such as germanium (Ge), or a compound semiconductor, such as silicon carbide (SiC), gallium arsenide (GaAs), indium arsenide (InAs), or indium phosphide (InP). The bonding layer 140 may be an oxide material same or similar to the encapsulating material 124, so the substrate 130 is bonded to the encapsulated electronic die 120 through oxide bonding. In some embodiments, the bonding layer 140 may be a high thermal conductive hybrid bonding layer, which may include diamond-like carbon (DLC) coating, silicon carbide coating, Cu-SiOx coating, SiON coating, or the like.

Figure 6:
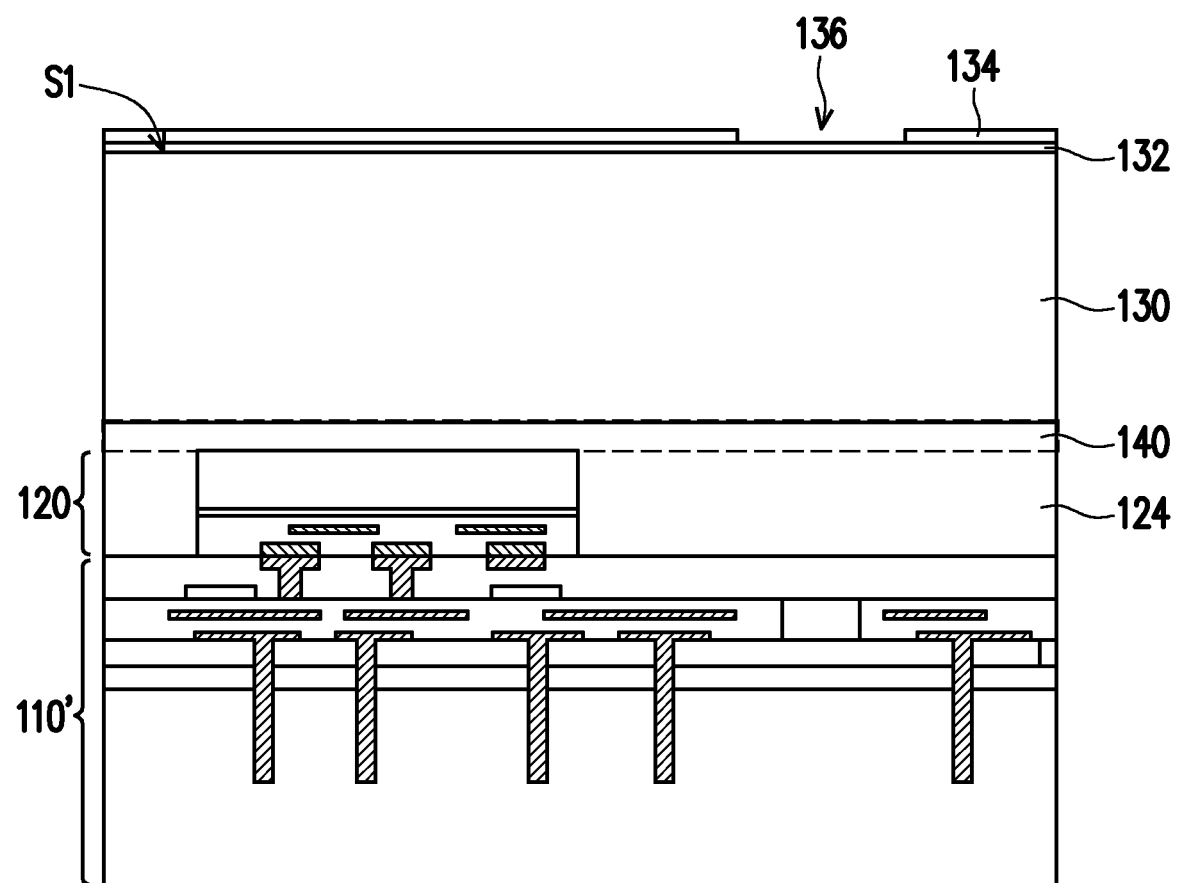
Figure 7:
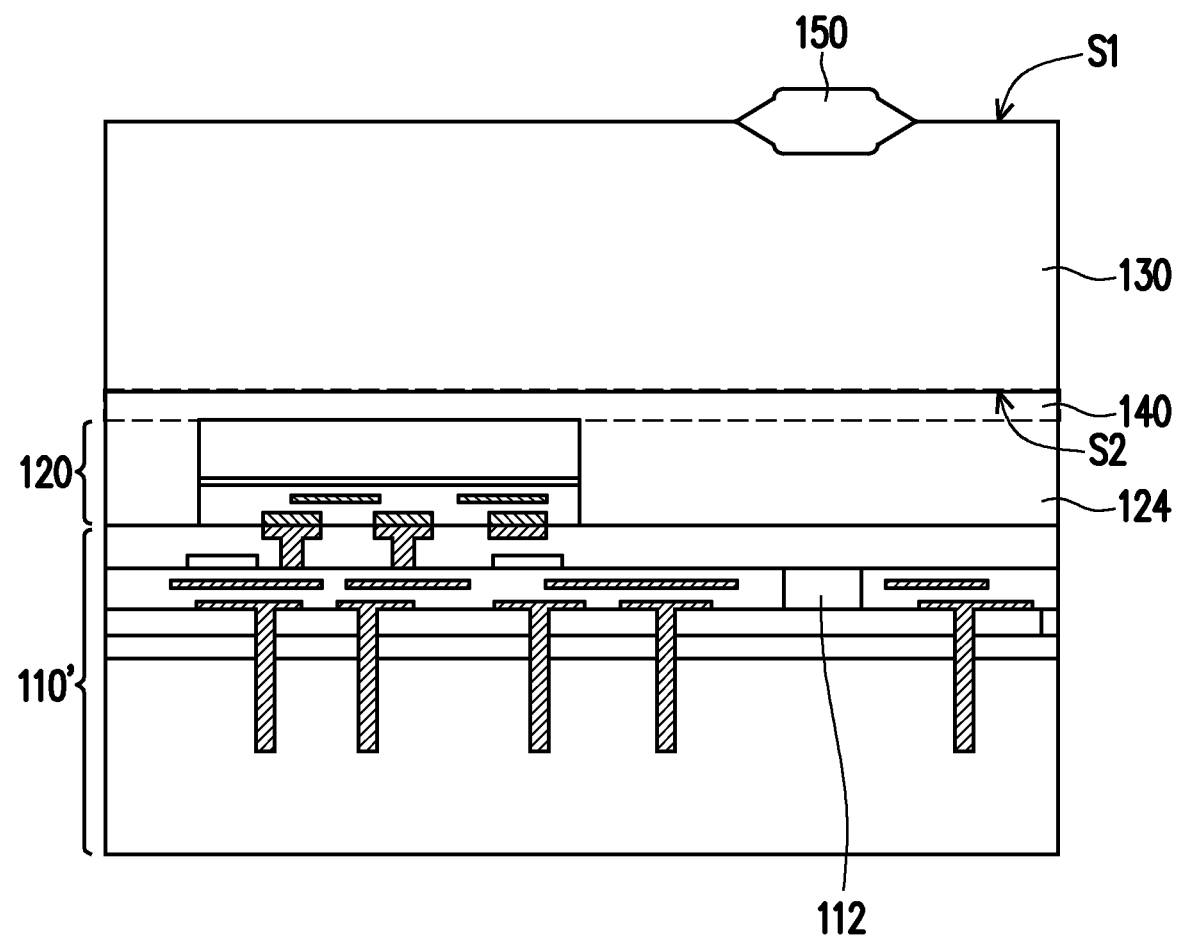

With now reference to FIG. 6 and FIG. 7, a lens structure 150 is formed over the photonic die 110'. The lens structure 150 is overlapped with the optical coupler 112 from a top view, so the optical coupler 112 is optically coupled to an optical signal source (e.g., optical signal source 180 shown in FIG. 10) through the lens structure 150. With the configuration of the substrate 130 for providing mechanical strength to the semiconductor package, the distance between the optical signal source (e.g., the optical signal source 180 shown in FIG. 10) to the optical coupler 112 is increased, which may result in decadence and/or divergence of light beams from the optical signal source. Accordingly, the lens structure 150 is configured to focus light beams from the optical signal source, so the optical coupler 112 can be optically coupled to the optical signal source through the lens structure 150.

In the present embodiment, the (first) lens structure 150 is formed (disposed) on a surface of the substrate 130. For example, the lens structure 150 is disposed on a back surface S1 of the substrate 130 facing away from the encapsulated electronic die 120, but the disclosure is not limited thereto. The lens structure can be disposed anywhere that is overlapped with the optical coupler 112 from a top view as long as the optical coupler 112 can be optically coupled to the optical signal source (e.g., the optical signal source 180 shown in FIG. 10) through the lens structure.

Figure 11:
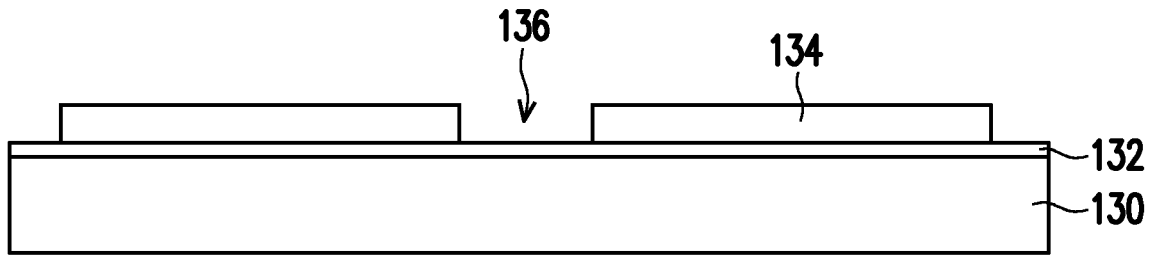
FIG. 11 to FIG. 13 illustrate partial cross sectional views of intermediate stages in the manufacturing of a lens structure on a semiconductor package according to some exemplary embodiments of the present disclosure.
Figure 13:
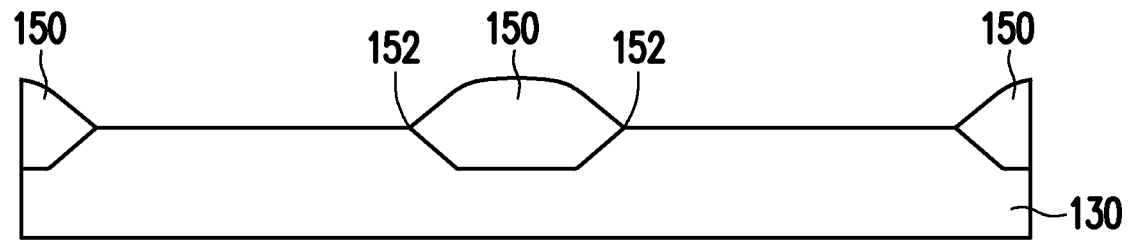

FIG. 11 to FIG. 13 illustrate partial cross sectional views of intermediate stages in the manufacturing of a semiconductor package according to some exemplary embodiments of the present disclosure. There are many manufacturing methods can be adopted to form the lens structure 150. FIG. 11 to FIG. 13 illustrate a local oxidation of silicon (LOCOS) process, which is one of the methods (process) for forming the lens structure 150 on the substrate 130, but other manufacturing methods can be applied, and the manufacturing methods can also be applied on other suitable surfaces for forming the lens structure thereon. The disclosure is not limited thereto.

Referring to FIG. 6 and FIG. 11, a pad layer 132 for isolation is formed on a surface of the substrate 130. The pad layer 132 may include a silicon oxide layer if the substrate 130 is a silicon substrate. In the present embodiment, the pad oxide layer 132 is formed on the back surface S1 of the substrate 130 by, for example, chemical vapor deposition (CVD), or other suitable methods. Then, a mask layer 134 such as silicon nitride ($Si_3N_4$) for a hard mask is deposited on the pad layer 132 by, for example, chemical vapor deposition (CVD), or other suitable methods. The mask layer 134 can be called a pad nitride layer. The mask layer 134 is firstly provided over the pad oxide layer 132 by, for example, chemical vapor deposition (CVD), and is patterned to form at least one opening 136 by which a desired area to have the lens structure 150 formed thereon is exposed. To perform local oxidation, the areas not meant to be oxidized will be covered by the mask layer 134, which does not permit the diffusion of oxygen at high temperatures (thermal oxidation is performed in temperatures between 800 and 1200° C.).

Referring to FIG. 12 and FIG. 13, a field oxidation is then performed to form the lens structure 150 on the substrate 130 exposed by the opening 136 of the mask layer 134. During the growth of the immersed insulating thermal oxide structures, the mask layer 134 is pushed upwards. Without the pad layer 132 (also known as pad oxide or buffer oxide), this would create too much tension in the substrate 130 and the plastic deformation would occur. At high temperatures, the viscosity of silicon oxide (pad layer 132) decreases and the stress created between the substrate 130 and mask layer 134, by the growth of the thermal oxide, is relieved. Then, the lens structure 150 is formed by thermal oxidation of silicon. During this process, the silicon substrate 130 is consumed and replaced by silicon oxide. The mask layer 134 is then removed. In the present embodiment, the lens structure 150 formed by the LOCOS process includes bird's beak portions 152 at two opposite sides of the lens structure 150 as it is shown in FIG. 7 and FIG. 13. It is noted that multiple lens structures 150 are illustrated in FIG. 13, but the disclosure does not limit the quantity of the lens structure to be formed on the substrate.

Figure 8:
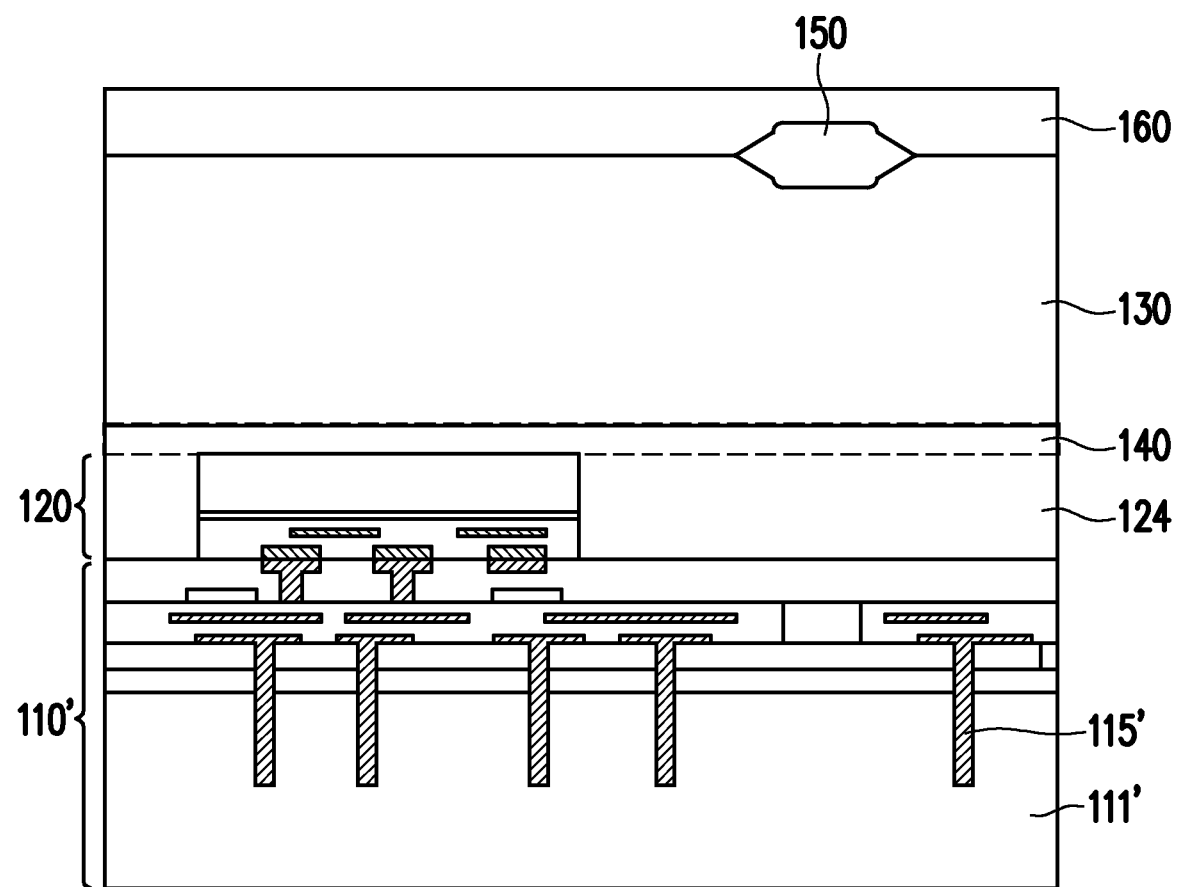

With now reference to FIG. 8, then, a protection layer 160 may be provided on the surface of the substrate 130 where the lens structure 150 is disposed. The protection layer 160 covers the lens structure 150 and flatten the upper surface of the semiconductor package. For example, the protection layer 160 may include inorganic material such as, but not limited to, aluminum oxide ($Al_2O_3$), silicon dioxide ($SiO_2$), silicon nitride ($SiN_x$), or the like. In some embodiments, the material of the protection layer 160 may be the same or similar to that of the encapsulating material 124, which is light-transparent oxide material.

Figure 9:
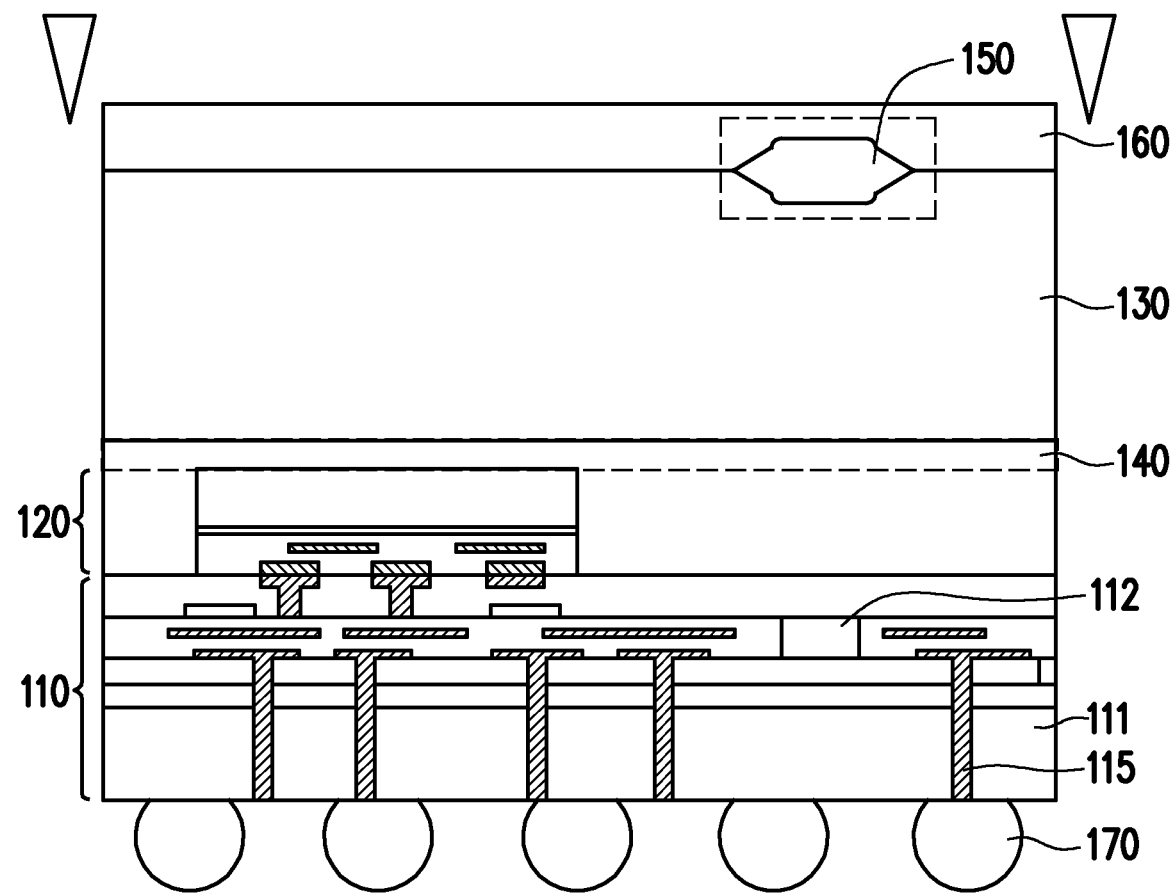

Referring to FIG. 8 and FIG. 9, then, the resultant structure shown in FIG. 8 may be flipped over, and a thinning process is performed on a backside of the substrate 111' of the photonic die 110' till ends of the blind via 115' is exposed, so as to form the through (substrate) vias 115 as shown in FIG. 9. In some embodiments, the thinning process includes a grinding process. In some other embodiments, the thinning process includes a chemical-mechanical polishing (CMP) process or the like. Then, a plurality of conductive bump(s) 170 are provided over the ground backside of the substrate 111 of the photonic die 110. In some embodiments, the conductive bumps 170 are electrically connected to the through vias 115 and may serve as electrical terminals of the semiconductor package.

Referring to FIG. 9 and FIG. 10, upon completion of the process described above, the resultant structure shown in FIG. 9, which is in a wafer form, is ready to be divided into individual semiconductor packages 100 by dicing through a plurality of scribing (dicing) lines to provide separation into individual semiconductor packages 100 shown in FIG. 10.

With such process and configuration, the electronic die 120 is directly bonded to the photonic die 110 by, for example, hybrid bonding technique to improve electrical performance of the semiconductor package 100. The substrate 130 is configured to provide mechanical strength, and the lens structure 150 is configured to focus light beams from the optical signal source. Thereby, the optical coupler 112 can be optically coupled to the optical signal source through the lens structure 150, so as to avoid or at least reduce decadence and/or divergence of light beams from the optical signal source due to increase of distance between the optical signal source 180 to the optical coupler 112.

Figure 14:
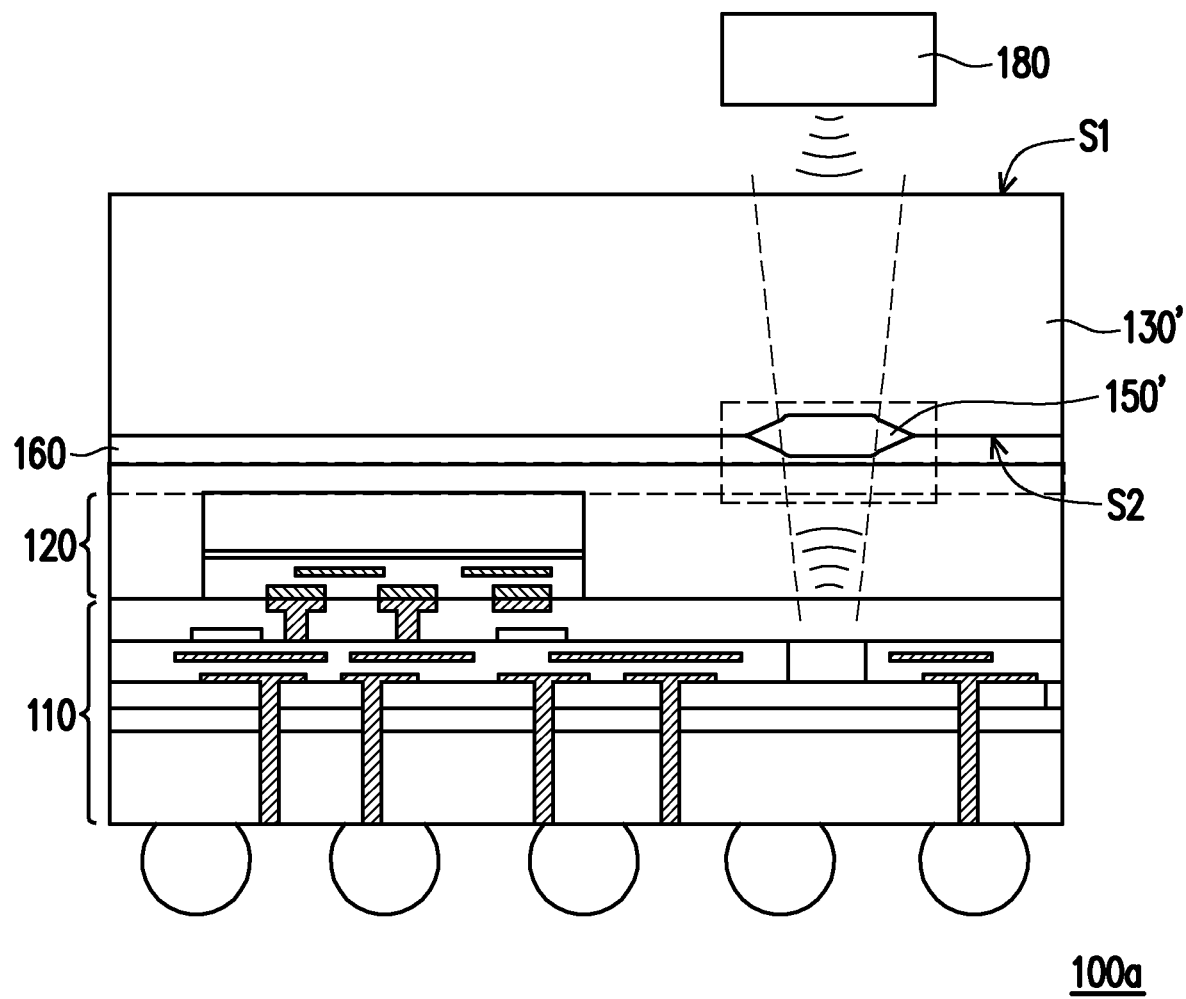
FIG. 14 to FIG. 20 illustrate cross sectional views of semiconductor packages according to different exemplary embodiments of the present disclosure.

FIG. 14 illustrates a cross sectional view of a semiconductor packages according to some exemplary embodiments of the present disclosure. It is noted that the semiconductor package 100*a* shown in FIG. 14 contains many features same as or similar to the semiconductor package 100 disclosed earlier with FIG. 1 to FIG. 13. For purpose of clarity and simplicity, detail description of same or similar features may be omitted, and the same or similar reference numbers denote the same or like components. The main differences between the semiconductor package 100*a* shown in FIG. 14 and the semiconductor package 100 in the previous embodiments are described as follows.

Referring to FIG. 14, in some embodiments, the lens structure 150' may be firstly formed on the substrate 130', covered with the protection layer 160, and then the substrate 130' is bonded to the encapsulated electronic die 120. In the present embodiment, the substrate 130' is bonded to the encapsulated electronic die 120 with the lens structure 150' facing the encapsulated electronic die 120. In other words, the lens structure 150' is disposed on a front surface S2 of the substrate 130' that faces the encapsulated electronic die 120 and is still overlapped with the optical coupler 112 from a top view. The lens structure 150' may be formed by the same or similar process that forms the lens structure 150, and the size of the lens structure 150' may be different from the size of the lens structure 150 in FIG. 10 due to different optical requirement. In the present embodiment, the size of the lens structure 150' is substantially smaller than the size of the lens structure 150 since the lens structure 150' is further away from the optical signal source 180. However, the disclosure is not limited thereto.

Figure 15:
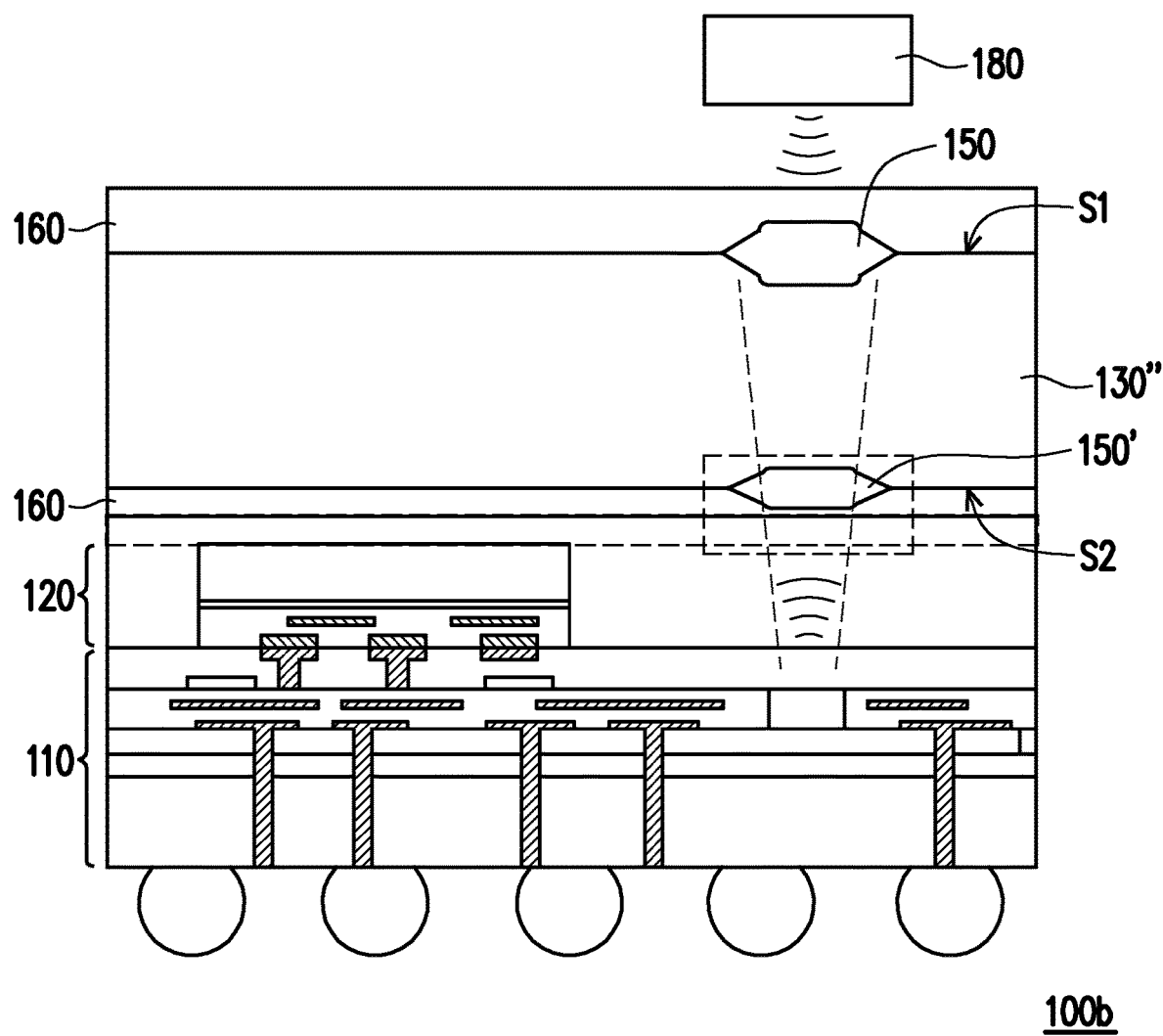

FIG. 15 illustrates a cross sectional view of a semiconductor packages according to some exemplary embodiments of the present disclosure. It is noted that the semiconductor package 100*b* shown in FIG. 15 contains many features same as or similar to the semiconductor package 100 disclosed earlier with FIG. 1 to FIG. 13. For purpose of clarity and simplicity, detail description of same or similar features may be omitted, and the same or similar reference numbers denote the same or like components. The main differences between the semiconductor package 100*b* shown in FIG. 15 and the semiconductor package 100 in the previous embodiments are described as follows.

Referring to FIG. 15, in accordance with some embodiments of the disclosure, the semiconductor package 100*b* may include a plurality of lens structures 150 and 150', which are disposed on, for example, two opposite surfaces (the back surface and the front surface) of the substrate 130". In the present embodiment, the lens structure 150' may be firstly formed on the substrate 130", and then be covered with the protection layer 160. Next, the substrate 130" with the lens structure 150' is bonded to the encapsulated electronic die 120 with the lens structure 150' facing the encapsulated electronic die 120. In other words, the lens structure 150' is disposed on the front surface S2 of the substrate 130" facing the encapsulated electronic die 120 and is still overlapped with the optical coupler 112 from a top view. Then, the lens structure 150 may be formed on the back surface S1 of the substrate 130" facing away from the encapsulated electronic die 120 and covered by the protection layer 160. In other embodiments, the lens structures 150 and 150' may both be pre-formed on the substrate 130" and covered by the protection layer 160. Then, the substrate 130" is bonded to the encapsulated electronic die 120 with the lens structure 150' facing encapsulated electronic die 120. The lens structure 150' may be formed by the same or similar process (e.g., LOCOS process, etching process, or the like) that forms the lens structure 150, and the size of the lens structure 150' may be different from the size of the lens structure 150 due to different optical requirement. In the present embodiment, the size of the lens structure 150' is substantially smaller than the size of the lens structure 150 since the lens structure 150' is further away from the optical signal source 180. However, the disclosure is not limited thereto.

Figure 16:
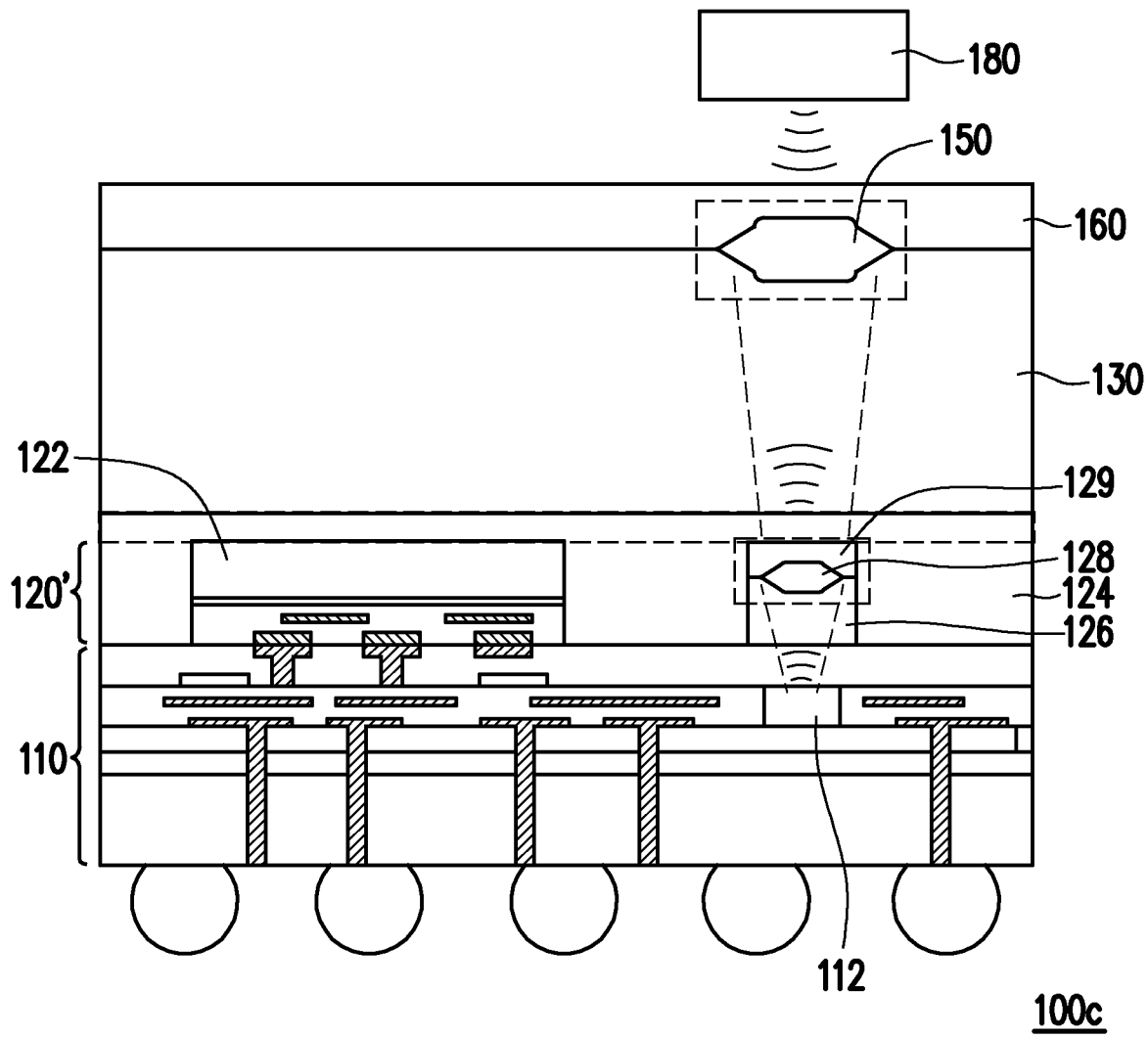

FIG. 16 illustrates a cross sectional view of a semiconductor packages according to some exemplary embodiments of the present disclosure. It is noted that the semiconductor package 100*c* shown in FIG. 16 contains many features same as or similar to the semiconductor package 100 disclosed earlier with FIG. 1 to FIG. 13. For purpose of clarity and simplicity, detail description of same or similar features may be omitted, and the same or similar reference numbers denote the same or like components. The main differences between the semiconductor package 100*c* shown in FIG. 16 and the semiconductor package 100 in the previous embodiments are described as follows.

Referring to FIG. 16, in accordance with some embodiments of the disclosure, the encapsulated electronic die 120' may further include at least one dummy die 126. In some embodiments, the dummy die 126 is at least laterally encapsulated by the encapsulating material 124 to reduce the amount of encapsulating material 124 and help improving coefficient of thermal expansion (CTE) mismatch, which results in warpage of the semiconductor package. In the present embodiments, the dummy die 126 may include a (second) lens structure 128, which is overlapped with the optical coupler 112 from a top view. Accordingly, the lens structure 128 on the dummy die and the lens structure 150 on the substrate 130 are both disposed along a light transmitting path of light beams from the optical signal source 180 to help focusing the light beams from the optical signal source 180.

In some embodiments, the dummy die 126 may be bonded over the photonic die 110 before the encapsulating material 124 is provided over the photonic die 110. For example, the electronic die 122 and the dummy die 126 may be picked and placed (bonded) onto the photonic die 110 at the same step. Then, the lens structure 128 is formed on a surface of the dummy die 126. In the present embodiment, the lens structure 128 is formed on the surface of the dummy die 126 facing away from the photonic die 110. The lens structure 128 may be formed by the same or similar process (e.g., LOCOS process, etching process, or the like) that forms the lens structure 150, and the size of the lens structure 128 may be different from the size of the lens structure 150 due to different optical requirement. In the present embodiment, the size of the lens structure 128 is substantially smaller than the size of the lens structure 150 since the lens structure 150' is further away from the optical signal source 180. However, the disclosure is not limited thereto. Then, a protection layer 129 is provided over on a surface of the dummy die 126 where the lens structure 128 is disposed, and covers the lens structure 128. The material of the protection layer 129 may be the same as or similar to the material of the protection layer 160. In the present embodiment, an upper surface of the protection layer 129 is coplanar with an upper surface of the electronic die 122. Then, the encapsulating material 124 is provided over the photonic die 110 to at least laterally encapsulate the electronic die and the dummy die 126 with the lens structure 128.

In some embodiments, the lens structure 128 may be pre-formed on the dummy die 126 by, for example, LOCOS process, etching process, or the like, and then the electronic die 122 and the dummy die 126 with the pre-formed lens structure 128 are picked and placed (bonded) onto the photonic die 110. The encapsulating material 124 is then provided over the photonic die 110 to encapsulate the electronic die 122 and the dummy die 126 altogether. The disclosure does not limit the order of the manufacturing steps of the semiconductor package.

Figure 17:
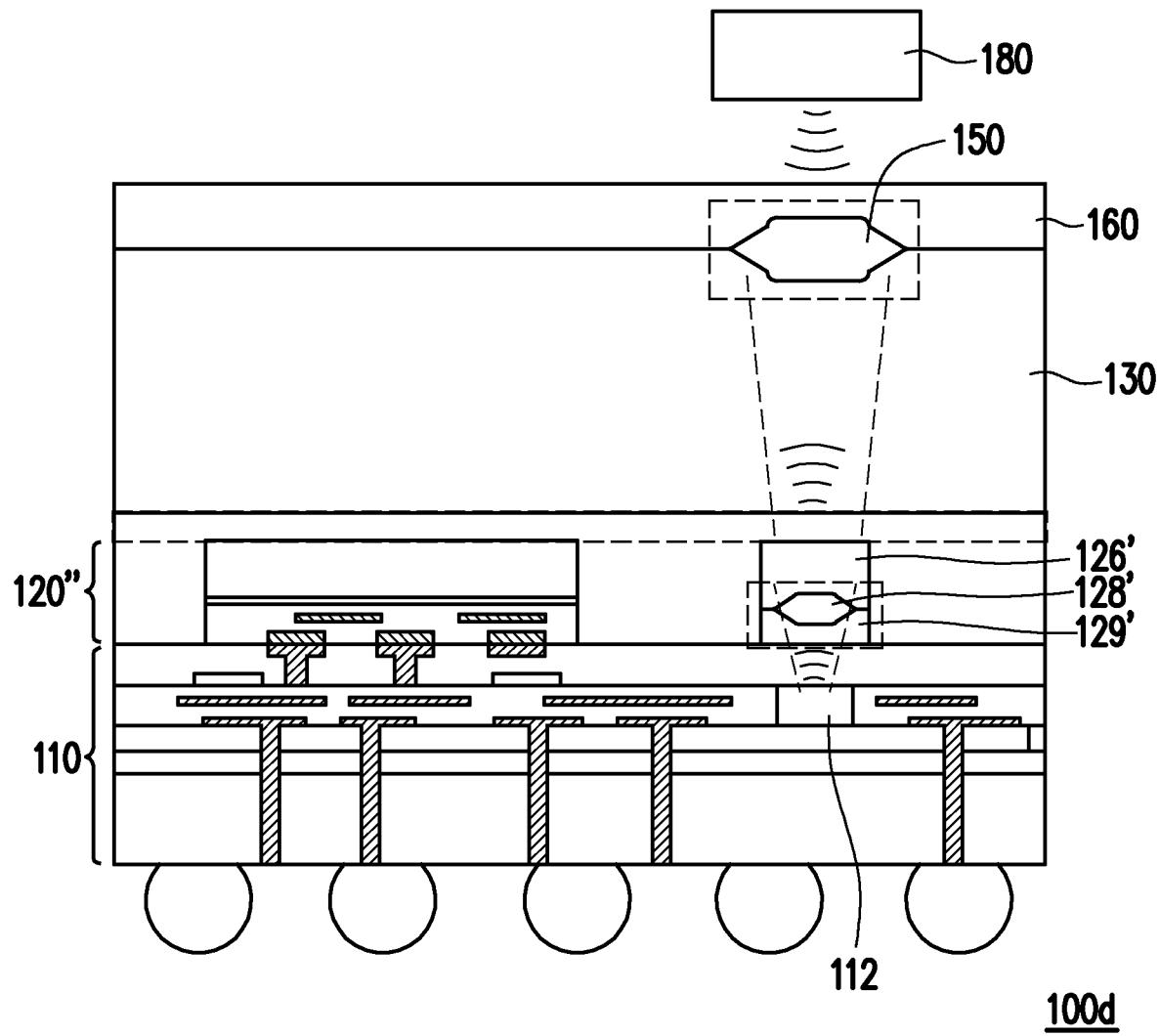

FIG. 17 illustrates a cross sectional view of a semiconductor packages according to some exemplary embodiments of the present disclosure. It is noted that the semiconductor package 100d shown in FIG. 17 contains many features same as or similar to the semiconductor package 100c disclosed earlier with FIG. 16. For purpose of clarity and simplicity, detail description of same or similar features may be omitted, and the same or similar reference numbers denote the same or like components. The main differences between the semiconductor package 100d shown in FIG. 17 and the semiconductor package 100c disclosed earlier with FIG. 16 are described as follows.

Referring to FIG. 17, in accordance with some embodiments of the disclosure, the encapsulated electronic die 120″ may further include a dummy die 126'. In some embodiments, the dummy die 126' is configured to reduce the use of encapsulating material 124 and help improving coefficient of thermal expansion (CTE) mismatch, so as to improve warpage of the semiconductor package 100d. In the present embodiments, the dummy die 126 may include a (second) lens structure 128', which is configured to be overlapped with the optical coupler 112 from a top view. Accordingly, the lens structure 128' on the dummy die 126' and the lens structure 150 on the substrate 130 are both disposed along a light transmitting path of light beams from the optical signal source 180 to help focusing the light beams from the optical signal source 180.

In some embodiments, the lens structure 128' may be pre-formed on the dummy die 126', and covered with a protection layer 129'. Then, the dummy die 126' with the lens structure 128' and the protection layer 129' are bonded over the photonic die 110 before the encapsulating material 124 is provided over the photonic die 110. In the present embodiment, the dummy die 126' may be bonded over the photonic die 110 with the lens structure 128' facing the photonic die 110. That is to say, the lens structure 128' is disposed on the surface of the dummy die 126' facing the photonic die 110. For example, the electronic die 122 and the dummy die 126' may be picked and placed (bonded) over the photonic die 110 at the same step. The lens structure 128 may be formed by the same or similar process (e.g., LOCOS process, etching process, or the like) that forms the lens structure 150, and the size of the lens structure 128' may be different from the size of the lens structure 150 due to different optical requirement. In the present embodiment, the size of the lens structure 128' is substantially smaller than the size of the lens structure 150 since the lens structure 150 is further away from the optical signal source 180. However, the disclosure is not limited thereto. The material of the protection layer 129' may be the same as or similar to the material of the protection layer 160. Then, the encapsulating material 124 is provided over the photonic die 110 to at least laterally encapsulate the electronic die and the dummy die 126' with the lens structure 128' and the protection layer 129'.

In some embodiments, the lens structure 128' may be pre-formed on the dummy die 126' by, for example, LOCOS process, etching process, or the like, and then the electronic die 122 and the dummy die 126' with the pre-formed lens structure 128' facing down are picked and placed (bonded) over the photonic die 110. The encapsulating material 124 is then provided over the photonic die 110 to encapsulate the electronic die 122 and the dummy die 126' altogether. The disclosure does not limit the order of the manufacturing steps of the semiconductor package.

Figure 18:
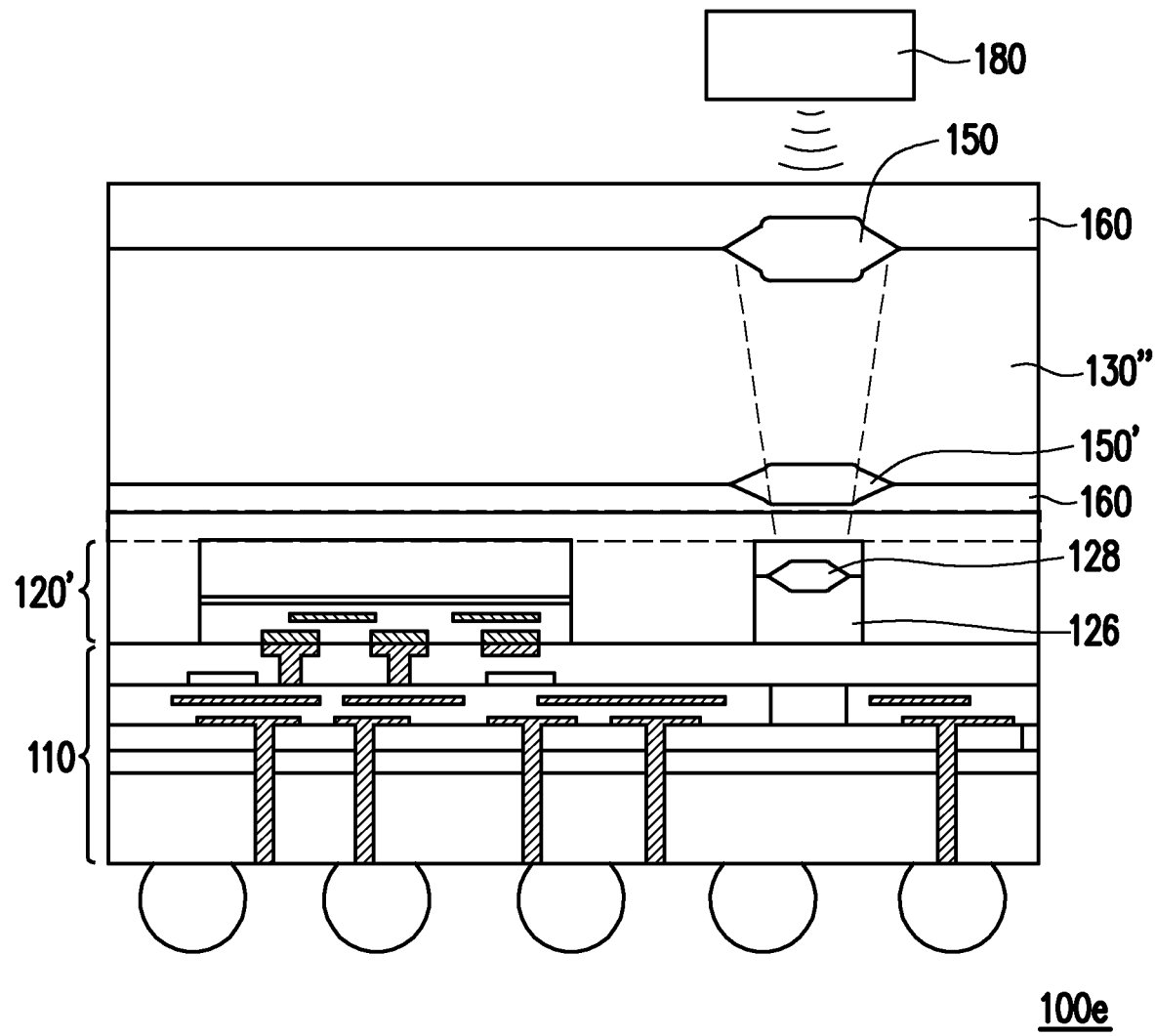

FIG. 18 illustrates a cross sectional view of a semiconductor packages according to some exemplary embodiments of the present disclosure. It is noted that the semiconductor package 100e shown in FIG. 18 contains many features same as or similar to the semiconductor package 100c disclosed earlier with FIG. 16. For purpose of clarity and simplicity, detail description of same or similar features may be omitted, and the same or similar reference numbers denote the same or like components. The main differences between the semiconductor package 100e shown in FIG. 18 and the semiconductor package 100c disclosed earlier with FIG. 16 are described as follows.

Referring to FIG. 18, in accordance with some embodiments of the disclosure, the encapsulated electronic die 120' may further include a dummy die 126. In some embodiments, the dummy die 126 is configured to reduce the use of encapsulating material 124 and help improving coefficient of thermal expansion (CTE) mismatch, so as to improve warpage of the semiconductor package 100e. In the present embodiments, the dummy die 126 may include a (second) lens structure 128, which is configured to be overlapped with the optical coupler 112 from a top view.

In some embodiments, the dummy die 126 may be bonded over the photonic die 110 before the encapsulating material 124 is provided over the photonic die 110. For example, the electronic die 122 and the dummy die 126 may be picked and placed (bonded) onto the photonic die 110 at the same step. Then, the lens structure 128 is formed on a surface of the dummy die 126. In the present embodiment, the lens structure 128 is formed on the surface of the dummy die 126 facing away from the photonic die 110. The lens structure 128 may be formed by the same or similar process (e.g., LOCOS process, etching process, or the like) that forms the lens structure 150, and the size of the lens structure 128 may be different from the size of the lens structure 150 due to different optical requirement. In the present embodiment, the size of the lens structure 128 is substantially smaller than the size of the lens structure 150 since the lens structure 150' is further away from the optical signal source 180. However, the disclosure is not limited thereto. Then, a protection layer 129 is provided over on a surface of the dummy die 126 where the lens structure 128 is disposed, and covers the lens structure 128. The material of the protection layer 129 may be the same as or similar to the material of the protection layer 160. In the present embodiment, an upper surface of the protection layer 129 is coplanar with an upper surface of the electronic die 122. Then, the encapsulating material 124 is provided over the photonic die 110 to at least laterally encapsulate the electronic die and the dummy die 126 with the lens structure 128.

In some embodiments, the lens structure 128 may be pre-formed on the dummy die 126 by, for example, LOCOS process, etching process, or the like, and then the electronic die 122 and the dummy die 126 with the pre-formed lens structure 128 are picked and placed (bonded) onto the photonic die 110. The encapsulating material 124 is then provided over the photonic die 110 to encapsulate the electronic die 122 and the dummy die 126 altogether. The disclosure does not limit the order of the manufacturing steps of the semiconductor package.

In accordance with some embodiments of the disclosure, the semiconductor package 100e may include a plurality of (first) lens structures 150 and 150', which are disposed on, for example, two opposite surfaces (the back surface and the front surface) of the substrate 130". In the present embodiment, the lens structure 150' may be firstly formed on the substrate 130", and then be covered with the protection layer 160. Next, the substrate 130" with the lens structure 150' is bonded to the encapsulated electronic die 120' with the lens structure 150' facing the encapsulated electronic die 120. In other words, the lens structure 150' is disposed on the front surface S2 of the substrate 130" facing the encapsulated electronic die 120 and is still overlapped with the optical coupler 112 from a top view. Then, the lens structure 150 may be formed on the back surface S1 of the substrate 130" facing away from the encapsulated electronic die 120 and covered by the protection layer 160. In other embodiments, the lens structures 150 and 150' may both be pre-formed on the substrate 130" and covered by the protection layer 160. Then, the substrate 130" is bonded to the encapsulated electronic die 120 with the lens structure 150' facing encapsulated electronic die 120. The lens structure 150' may be formed by the same or similar process (e.g., LOCOS process, etching process, or the like) that forms the lens structure 150, and the size of the lens structures 150, 150' 128' may be different from one another due to different optical requirement. For example, the size of the lens structure 150' may be substantially smaller than the size of the lens structure 150 since the lens structure 150' is further away from the optical signal source 180. However, the disclosure is not limited thereto. Accordingly, the lens structure 128 on the dummy die 126 and the lens structures 150, 150' on the substrate 130 are all disposed along a light transmitting path of light beams from the optical signal source 180 to help focusing the light beams from the optical signal source 180.

Figure 19:
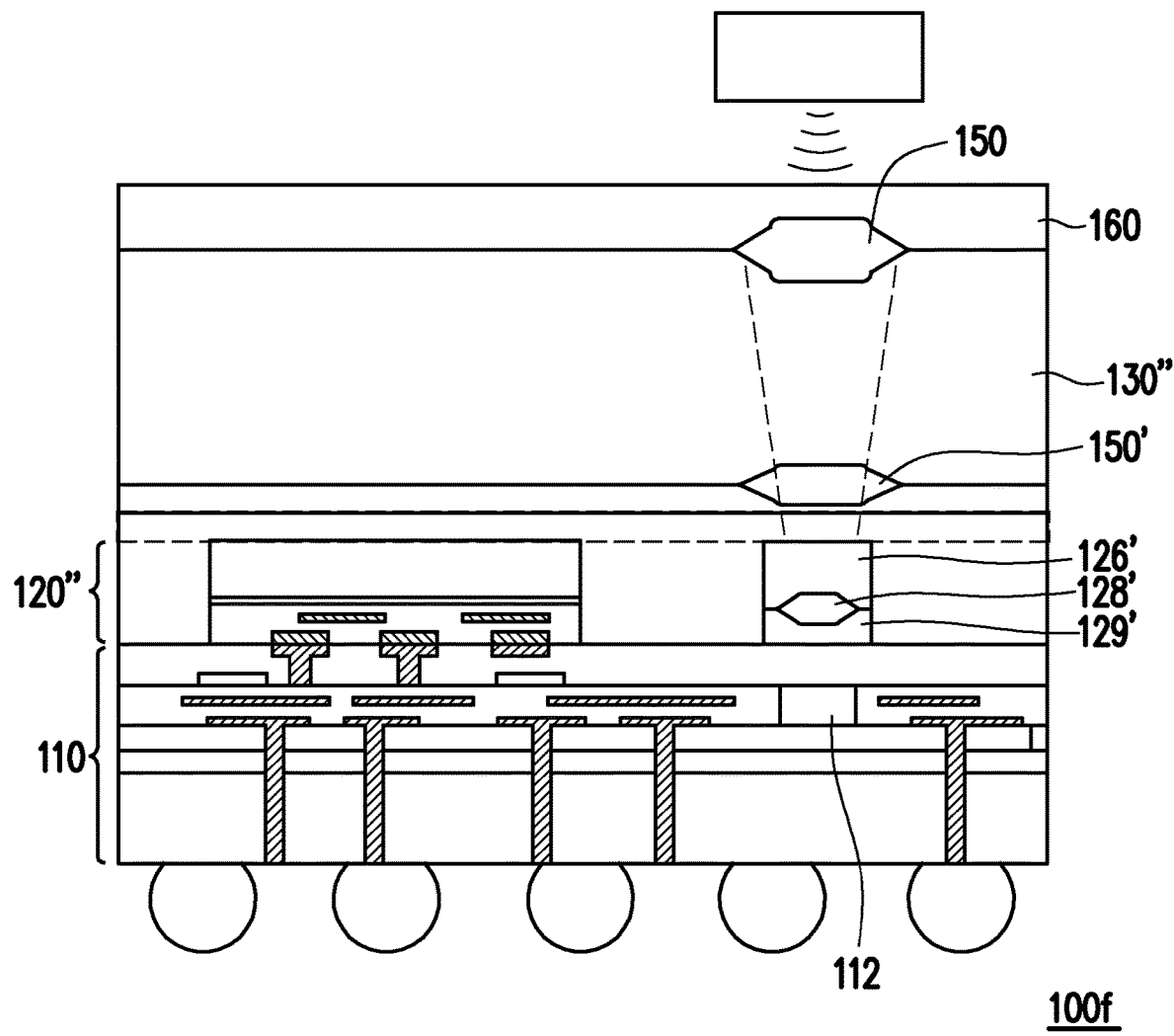

FIG. 19 illustrates a cross sectional view of a semiconductor packages according to some exemplary embodiments of the present disclosure. It is noted that the semiconductor package 100f shown in FIG. 19 contains many features same as or similar to the semiconductor package 100c disclosed earlier with FIG. 16. For purpose of clarity and simplicity, detail description of same or similar features may be omitted, and the same or similar reference numbers denote the same or like components. The main differences between the semiconductor package 100f shown in FIG. 19 and the semiconductor package 100c disclosed earlier with FIG. 16 are described as follows.

Referring to FIG. 19, in accordance with some embodiments of the disclosure, the encapsulated electronic die 120" may further include a dummy die 126'. In some embodiments, the dummy die 126' is configured to reduce the use of encapsulating material 124 and help improving coefficient of thermal expansion (CTE) mismatch, so as to improve warpage of the semiconductor package 100f. In the present embodiments, the dummy die 126 may include a (second) lens structure 128', which is configured to be overlapped with the optical coupler 112 from a top view.

In some embodiments, the lens structure 128' may be pre-formed on the dummy die 126', and covered with a protection layer 129'. Then, the dummy die 126' with the lens structure 128' and the protection layer 129' are bonded over the photonic die 110 before the encapsulating material 124 is provided over the photonic die 110. In the present embodiment, the dummy die 126' may be bonded over the photonic die 110 with the lens structure 128' facing the photonic die 110. That is to say, the lens structure 128' is disposed on the surface of the dummy die 126' facing the photonic die 110. For example, the electronic die 122 and the dummy die 126' may be picked and placed (bonded) over the photonic die 110 at the same step. The lens structure 128 may be formed by the same or similar process (e.g., LOCOS process, etching process, or the like) that forms the lens structure 150, and the size of the lens structure 128' may be different from the size of the lens structure 150 due to different optical requirement. In the present embodiment, the size of the lens structure 128' is substantially smaller than the size of the lens structure 150 since the lens structure 150 is further away from the optical signal source 180. However, the disclosure is not limited thereto. The material of the protection layer 129' may be the same as or similar to the material of the protection layer 160. Then, the encapsulating material 124 is provided over the photonic die 110 to at least laterally encapsulate the electronic die and the dummy die 126' with the lens structure 128' and the protection layer 129'.

In accordance with some embodiments of the disclosure, the semiconductor package 100f may include a plurality of (first) lens structures 150 and 150', which are disposed on, for example, two opposite surfaces (the back surface and the front surface) of the substrate 130". In the present embodiment, the lens structure 150' may be firstly formed on the substrate 130", and then be covered with the protection layer 160. Next, the substrate 130" with the lens structure 150' is bonded to the encapsulated electronic die 120' with the lens structure 150' facing the encapsulated electronic die 120. In other words, the lens structure 150' is disposed on the front surface S2 of the substrate 130" facing the encapsulated electronic die 120 and is still overlapped with the optical coupler 112 from a top view. Then, the lens structure 150 may be formed on the back surface S1 of the substrate 130" facing away from the encapsulated electronic die 120 and covered by the protection layer 160. In other embodiments, the lens structures 150 and 150' may both be pre-formed on the substrate 130" and covered by the protection layer 160. Then, the substrate 130" is bonded to the encapsulated electronic die 120 with the lens structure 150' facing encapsulated electronic die 120. The lens structure 150' may be formed by the same or similar process (e.g., LOCOS process, etching process, or the like) that forms the lens structure 150, and the size of the lens structures 150, 150' 128' may be different from one another due to different optical requirement. For example, the size of the lens structure 150' may be substantially smaller than the size of the lens structure 150 since the lens structure 150' is further away from the optical signal source 180. However, the disclosure is not limited thereto. Accordingly, the lens structure 128 on the dummy die 126 and the lens structures 150, 150' on the substrate 130 are all disposed along a light transmitting path of light beams from the optical signal source 180 to help focusing the light beams from the optical signal source 180.

Figure 20:
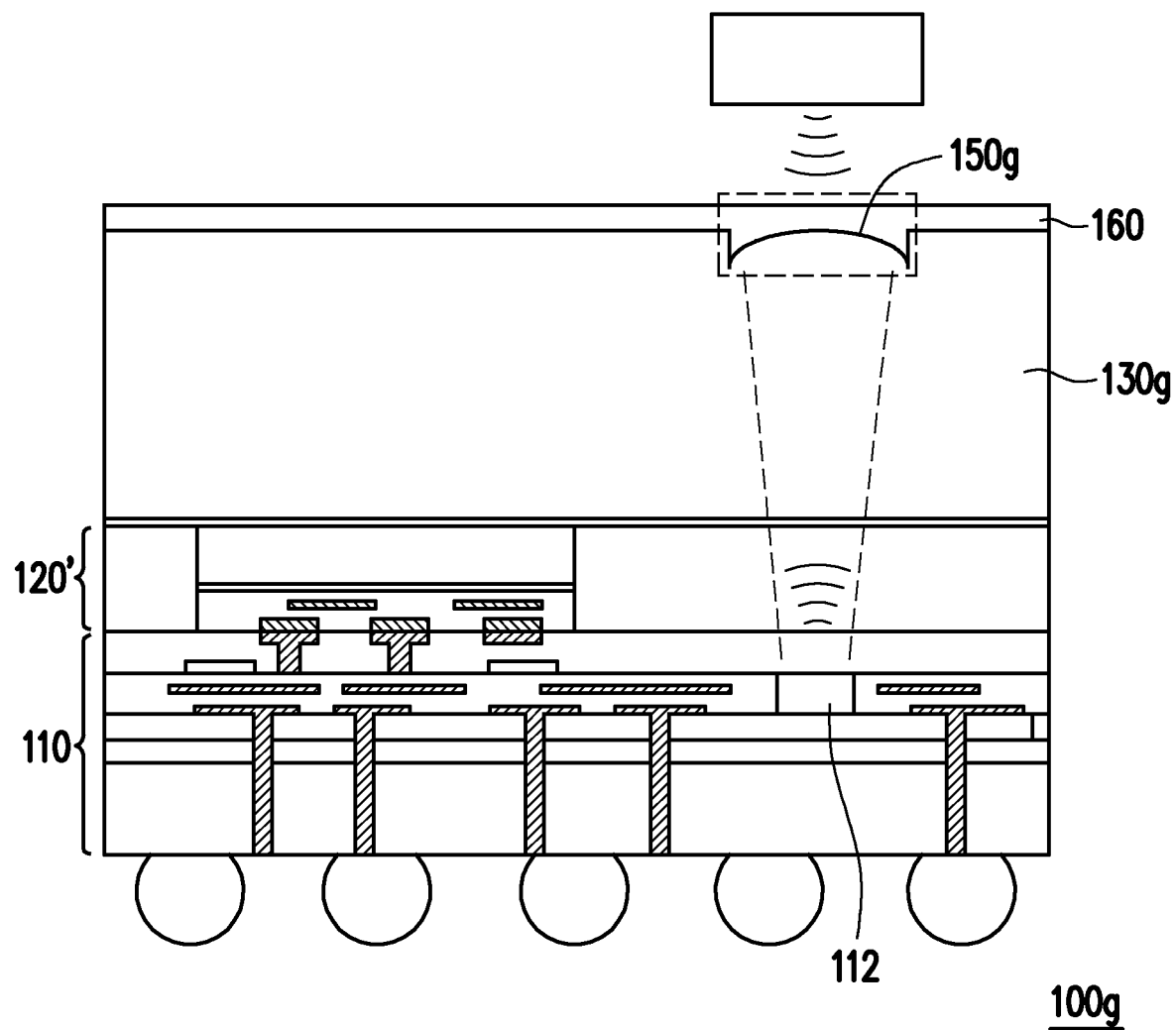

FIG. 20 illustrates a cross sectional view of a semiconductor packages according to some exemplary embodiments of the present disclosure. FIG. 21 to FIG. 25 illustrate partial cross sectional views of intermediate stages in the manufacturing of a lens structure on a semiconductor package according to some exemplary embodiments of the present disclosure. It is noted that the semiconductor package 100g shown in FIG. 20 contains many features same as or similar to the semiconductor package 100 disclosed earlier with FIG. 1 to FIG. 10. For purpose of clarity and simplicity, detail description of same or similar features may be omitted, and the same or similar reference numbers denote the same or like components. The main differences between the semiconductor package 100g shown in FIG. 20 and the semiconductor package 100 disclosed earlier with FIG. 1 to FIG. 10 are described as follows.

There are many manufacturing methods can be adopted to form the lens structure on the semiconductor package. FIG. 21 to FIG. 25 illustrate another possible method (process) for fabricating the lens structure 150g on the substrate 130g. Certainly, other manufacturing methods can be applied, and the manufacturing methods can also be applied on other suitable surfaces (e.g. surface of dummy die) for forming the lens structure thereon. The disclosure is not limited thereto.

Figure 21:
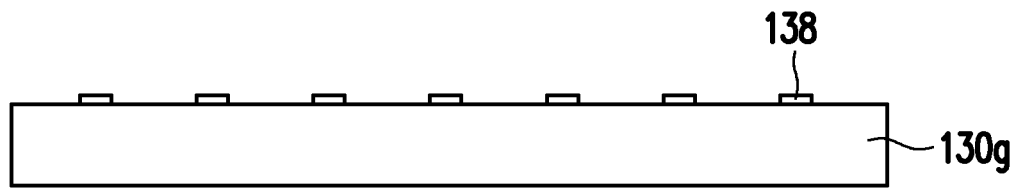
FIG. 21 to FIG. 25 illustrate partial cross sectional views of intermediate stages in the manufacturing of a lens structure on a semiconductor package according to some exemplary embodiments of the present disclosure.
Figure 22:
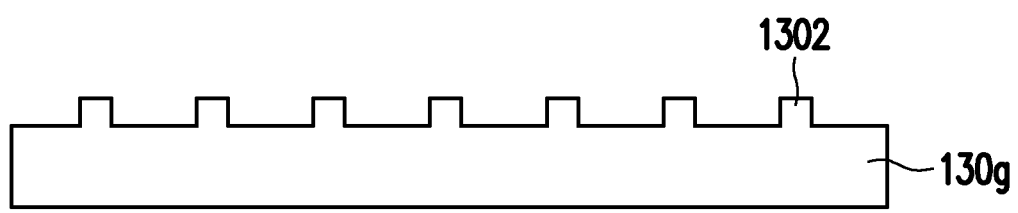
Figure 23:
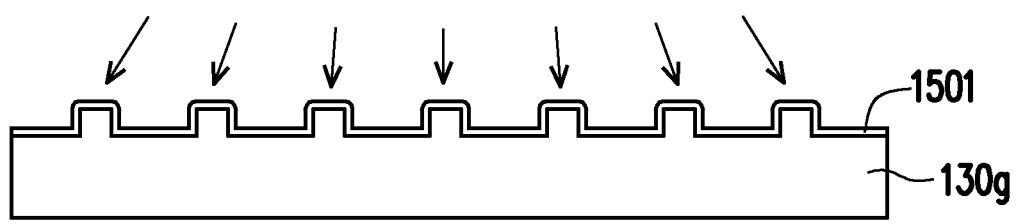
Figure 24:
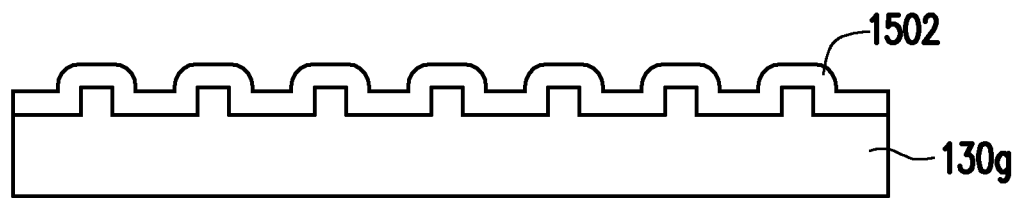
Figure 25:
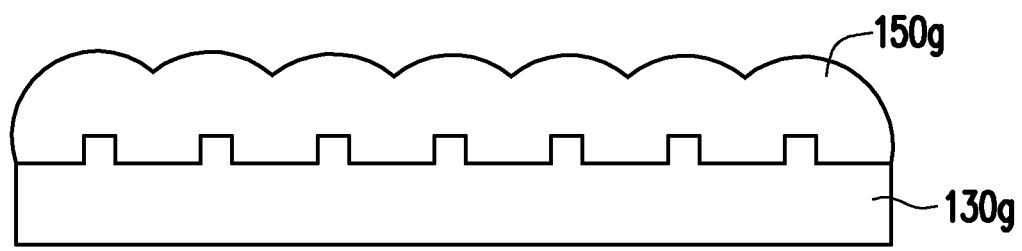

Referring to FIGS. 20 and 21, in accordance with some embodiments of the disclosure, the overall procedure for fabricating the lens structure 150g shown in FIG. 20 is illustrated schematically in FIG. 22 to FIG. 25, and mainly consists of two parts: silicon substrate fabrication (e.g., FIG. 21 to FIG. 22) and a-Si:H deposition (e.g., FIG. 23 to FIG. 25). Firstly, a patterned mask layer 138 is formed on the substrate 130g'. In some embodiments, the patterned mask layer 138 may be in two dimensional periodic array pattern, which is defined by, for example, a patterned photoresist layer (not shown). For example, a two dimensional periodic array pattern may be defined by electron beam lithography using a positive resist, and then a layer of mask layer was deposited on top of the patterned photoresist layer by, for example, electron beam evaporation. Then, the patterned photoresist layer was dissolved in resist remover, leaving a patterned mask layer 138 shown in FIG. 21. In some embodiments, the material of the patterned mask layer 138 includes chromium (Cr), or the like.

Referring to FIG. 22, then, a substrate 130g consisting of silicon pillars 1302 may be obtained by vertical etching the substrate by, for example, inductively coupled plasma reactive ion etching (ICP-RIE). Then, the residual patterned mask layer 138 is removed by, for example, immersing the substrate 130g in chromium etchant.

Referring to FIG. 23 to FIG. 25, a hydrogenated amorphous silicon (a-Si:H) layer is then deposited onto the substrate 130g using, for example, plasma enhanced chemical vapor deposition (PECVD). In the initial stage of deposition (e.g., the stage shown in FIG. 23), the a-Si:H was mainly deposited on the top surface of the silicon pillars 1302 and the other horizontal surfaces. As the deposition continued, a-Si:H gradually cover the silicon pillars 1302 in a conformal manner such that the deposition rate becomes substantially the same in all directions. Thus, the diameter of the lens structure increases as the deposition proceeds until the lateral diameter reaches that of the lattice pitch as it is shown in FIG. 24. Then, the boundaries of the lens structures 150g begin to overlap and the overall surface merges to form a continuous corrugated honeycomb structure and the fill factor increases to 100% as it is shown in FIG. 25. In this way, individual isolated hemisphere (lens structure 150g) can be obtained, as well as closely packed micro or nano dome structures. It is noted that the lens structure 150g in the form of hemisphere may also be applied to semiconductor packages shown in FIG. 14 to FIG. 20. The disclosure does not limit the form or the manufacturing method of the lens structure.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a photonic die, an encapsulated electronic die, a substrate, and a lens structure. The photonic die includes an optical coupler. The encapsulated electronic die is disposed over and bonded to the photonic die. The encapsulated electronic die includes an electronic die and an encapsulating material at least laterally encapsulating the electronic die. The substrate is disposed over and bonded to the encapsulated electronic die. The lens structure is disposed over the photonic die and is overlapped with the optical coupler from a top view. The optical coupler is configured to be optically coupled to an optical signal source through the lens structure.

In accordance with some embodiments of the disclosure, a semiconductor package includes a photonic die, an encapsulated electronic die, and a substrate. The photonic die includes an optical coupler. The encapsulated electronic die is over and bonded to the photonic die. The substrate is over and bonded to the encapsulated electronic die and includes a first lens structure, wherein the first lens structure is overlapped with the optical coupler from a top view, and optical coupler is configured to be optically coupled to an optical signal source through the first lens structure.

In accordance with some embodiments of the disclosure, a manufacturing method of a semiconductor package includes the following steps. A photonic die is provided, wherein the photonic die includes an optical coupler. An electronic die is bonded over the photonic die. An encapsulating material is provided over the photonic die, wherein the encapsulating material at least laterally encapsulates the electronic die. A substrate is bonded over the encapsulated electronic die. A lens structure is formed over the photonic die, wherein the lens structure is overlapped with the optical coupler from a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a photonic die comprising an optical coupler;
an electronic die over and bonded to the photonic die;
a substrate over and bonded to the electronic die; and
a first lens structure formed over the electronic die and overlapped with the optical coupler from a top view, wherein the optical coupler is configured to be optically coupled to an optical signal source through the first lens structure.

2. The semiconductor package as claimed in claim 1, wherein the electronic die is not overlapped with the optical coupler from a top view.

3. The semiconductor package as claimed in claim 1, wherein the first lens structure comprises bird's beak portions at two opposite sides of the first lens structure.

4. The semiconductor package as claimed in claim 1, wherein the first lens structure is disposed on a surface of the substrate, and the substrate is disposed over the electronic die.

5. The semiconductor package as claimed in claim 4, further comprising a protection layer disposed on the surface of the substrate where the protection layer is disposed over and covering the first lens structure.

6. The semiconductor package as claimed in claim 1, wherein the first lens structure is disposed on a back surface of the substrate facing away from the electronic die.

7. The semiconductor package as claimed in claim 1, wherein the first lens structure is disposed on a front surface of the substrate facing the electronic die.

8. The semiconductor package as claimed in claim 1, further comprising an encapsulating material at least laterally encapsulating the electronic die.

9. The semiconductor package as claimed in claim 8, further comprising a dummy die disposed over and bonded to the photonic die and a second lens structure disposed on a surface of the dummy die, wherein the encapsulating material at least laterally encapsulates the dummy die.

10. The semiconductor package as claimed in claim 9, further comprising a protection layer disposed on the surface of the dummy die where the second lens structure is disposed, wherein the protection layer covers the lens structure.

11. A semiconductor package, comprising:
a photonic die comprising an optical coupler;
an electronic die over and bonded to the photonic die; and
a substrate over and bonded to the electronic die and comprising a first lens structure, wherein the first lens structure is overlapped with the optical coupler from a top view, and optical coupler is configured to be optically coupled to an optical signal source through the first lens structure.

12. The semiconductor package as claimed in claim 11, further comprising a protection layer disposed on a surface of the substrate where the first lens structure is disposed and covering the first lens structure.

13. The semiconductor package as claimed in claim 11, wherein the first lens structure comprises a plurality of first lens structures disposed on two opposite surfaces of the substrate.

14. The semiconductor package as claimed in claim 11, further comprising a dummy die disposed over and bonded to the photonic die, an encapsulating material at least laterally encapsulating the dummy die and the electronic die, and the dummy die comprises a second lens structure overlapped with the optical coupler from a top view.

15. The semiconductor package as claimed in claim 14, further comprising a protection layer disposed on a surface of the dummy die where the second lens structure is disposed and covering the second lens structure.

16. The semiconductor package as claimed in claim 11, further comprising a bonding layer disposed between the electronic die and the substrate.

17. A manufacturing method of a semiconductor package, comprising:
providing a photonic die, wherein the photonic die comprises an optical coupler;
bonding an electronic die over the photonic die;
bonding a substrate over the electronic die; and
forming a first lens structure on a surface of the substrate and, wherein the first lens structure is overlapped with the optical coupler from a top view.

18. The manufacturing method of the semiconductor package as claimed in claim 17, further comprising:
bonding a dummy die over the photonic die;
providing an encapsulating material over the photonic die, wherein the encapsulating material at least laterally encapsulates the electronic die and the dummy die.

19. The manufacturing method of the semiconductor package as claimed in claim 18, further comprising:
forming a second lens structure on a surface of the dummy die.

20. The manufacturing method of the semiconductor package as claimed in claim 17, wherein the method of forming lens structure comprises a local oxidation of silicon (LOCOS) process or an etching process.

* * * * *